United States Patent [19]

Woo et al.

[11] Patent Number: 5,405,799
[45] Date of Patent: Apr. 11, 1995

[54] METHOD OF MAKING A STORAGE ELECTRODE OF DRAM CELL

[75] Inventors: Sang H. Woo, Kyoungki-do; Ha E. Jeon, Seoul; Young J. Park, Kyoungki-do, all of Rep. of Korea

[73] Assignee: Hyundai Electronics Industries, Co., Inc., Kyoungki-do, Rep. of Korea

[21] Appl. No.: 138,204

[22] Filed: Oct. 20, 1993

[30] Foreign Application Priority Data

Oct. 21, 1992 [KR] Rep. of Korea .............. 92-19351

[51] Int. Cl.6 ............................................. H01L 21/70
[52] U.S. Cl. ........................................ 437/52; 437/47; 437/60; 437/918; 437/977
[58] Field of Search .............. 437/47, 48, 52, 60, 437/235, 238, 918, 977; 257/309

[56] References Cited

U.S. PATENT DOCUMENTS

| | | | |
|---|---|---|---|
| 5,134,086 | 7/1992 | Ahn | 437/52 |
| 5,149,676 | 9/1992 | Kim et al. | 437/977 |
| 5,204,280 | 4/1993 | Dhong et al. | 437/52 |
| 5,254,503 | 10/1993 | Kenney | 437/977 |
| 5,256,587 | 10/1993 | Jun et al. | 437/52 |

FOREIGN PATENT DOCUMENTS 0129956  5/1990  Japan ........................... 437/52

*Primary Examiner*—Tom Thomas
*Attorney, Agent, or Firm*—Popham, Haik, Schnobrich & Kaufman, Ltd.

[57] ABSTRACT

A storage electrode of a DRAM cell in a highly-integrated semiconductor device has, in order to secure the surface area thereof greater than that of a conventional tunnel-type storage electrode, an upper plate of storage electrode formed over a lower plate of storage electrode separated therefrom by a predetermined distance, while interposing bars of various shapes formed of a conductive layer to electrically connect the upper and lower plates, and a method for manufacturing the storage electrode is also provided.

6 Claims, 4 Drawing Sheets

METHOD OF MAKING A STORAGE ELECTRODE OF DRAM CELL

BACKGROUND OF THE INVENTION

The present invention relates to a storage electrode of a DRAM cell in a highly-integrated semiconductor device and the manufacturing method therefor, and more particularly to a storage electrode having a plurality of bars consisting of conductive material between upper and lower plates thereof in order to enlarge the surface area of the storage electrode, and a method for manufacturing the same.

As the semiconductor devices become highly integrated, an area occupied by a capacitor of a DRAM cell shrinks, which in turn decreases the capacity of the capacitor. Therefore, a continuous effort has been made for developing a storage electrode whose surface area is enlarged to increase the capacity of the capacitor, while minimizing the per unit mean area occupied by the capacitor thereof. A tunnel-type storage electrode which is one example showing such an effort, and will be illustrated with reference to FIG. 1.

FIG. 1 is a sectional view showing the tunnel-type storage electrode of a DRAM cell manufactured by a conventional technique. Here, a field oxide layer 2 is formed on a predetermined portion of a silicon substrate 1, and a MOSFET(not shown) having a source, a drain and a gate electrode is formed on a predetermined portion of the silicon substrate 1. (A reference numeral 3 designates a drain diffusion region.) A first insulating layer 4 is formed on the entire surface of the structure in such a manner that a contact hole 5 is provided for the purpose of exposing the drain diffusion region 3, and a first conductive layer 6 for storage electrode comes in contact with the drain diffusion region 3. Then, a second conductive layer 8 for storage electrode having a space shaped as a tunnel, is formed thereon, thereby completing the tunnel-type storage electrode 10.

However, in spite of forming the storage electrode in the shape of tunnel, there is a limitation in enlarging the surface area of the storage electrode when the packing density is further increased. Nevertheless, in order to increase the surface area of the storage electrode, the tunnel height within the storage electrode must be increased, thus making the succeeding process difficult due to high steps generated by the storage electrode.

SUMMARY OF THE INVENTION

Therefore, it is an object of the present invention to provide a storage electrode of a DRAM cell capable of enlarging the surface area of the electrode over that of the above-described tunnel-shaped storage electrode.

It is another object of the present invention to provide a method for manufacturing a storage electrode capable of enlarging the surface area of the storage electrode.

To achieve the above object of the present invention, a storage electrode of a DRAM cell includes a lower electrode plate formed on an insulating layer on a transistor to contact with a diffusion region of the transistor. Also, an upper electrode plate is formed over the lower electrode plate being separated therefrom by a predetermined distance, and a plurality of bars of various shapes formed of a conductive material provided between the lower and upper electrode plates, so that the lower electrode plates are electrically connected to the upper electrode plate.

To achieve another object of the present invention, a method for manufacturing a storage electrode of a DRAM cell includes the steps of:

forming a first conductive layer onto the upper surface of a first insulating layer to contact with a predetermined diffusion region of a transistor provided between said first insulating layer and a substrate, as a lower electrode plate;

forming a second insulating layer on said first conductive layer;

patterning said second insulating layer to expose predetermined portions of said first conductive layer;

forming a second conductive layer on the upper surface of said second insulating layer and the exposed portions of said first conductive layer, as a upper electrode plate and a number of electrode bars provided between said upper and lower electrode plates;

patterning a photoresist mask for the storage electrode on said second conductive layer;

etching said second conductive layer to pattern said upper electrode plate;

throughly removing said second insulating layer; and etching said first conductive layer to pattern said lower electrode plate.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENT

Figure 1:
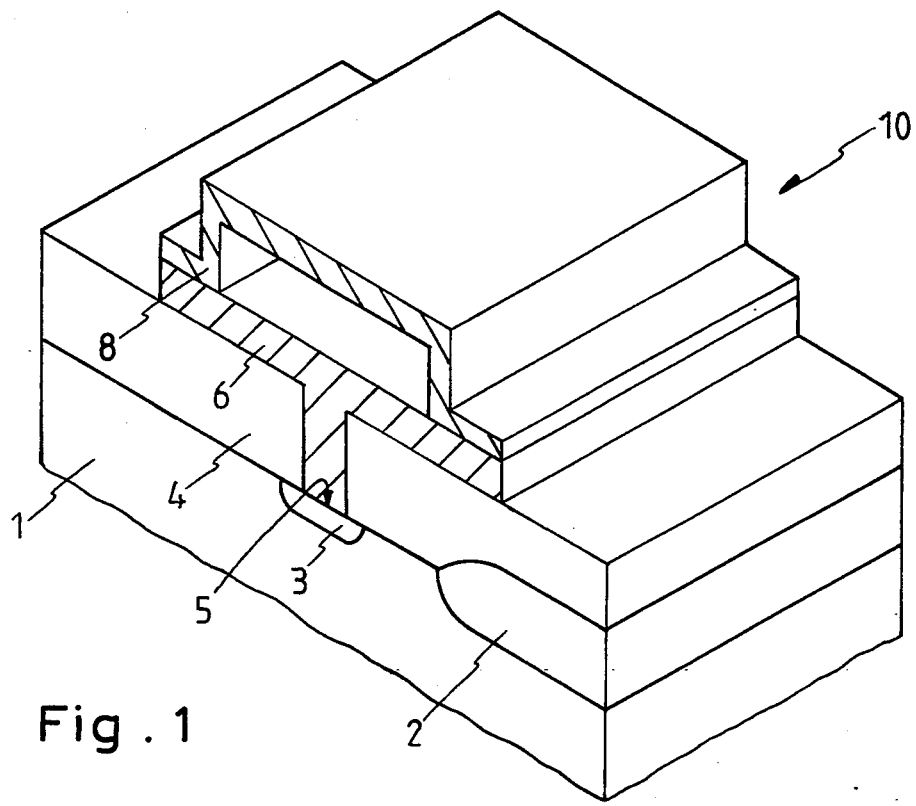
FIG. 1 is a sectional view showing a tunnel-type storage electrode of a DRAM cell manufactured by a conventional technique.
Figure 2:
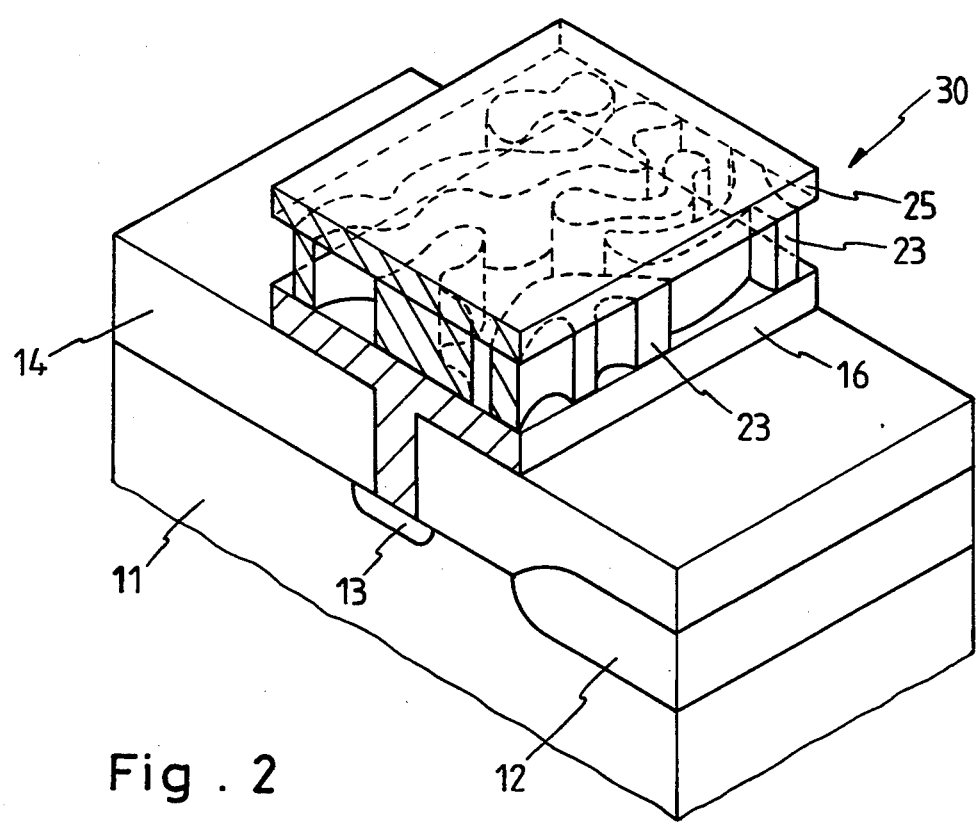
FIG. 2 is a sectional view showing a storage electrode of a DRAM cell having a lower plate and an upper plate separated from each other by a predetermined distance such that bars of various shapes are provided between them to enlarge the surface area.

Referring to FIG. 2, a field oxide layer 12 is formed on a predetermined portion of a silicon substrate 11, and an unshown MOSFET having a source, a drain and a gate electrode is formed on a predetermined portion of the silicon substrate 11. Thereafter, a first insulating layer 14 is formed on the whole surface of the structure in such a manner that a contact hole 15 is provided for exposing a drain diffusion legion 13, and a lower plate 16 of the storage electrode contacting the drain diffusion region 13 is formed. An upper plate 25 of the storage electrode is formed over the lower plate 16 of the storage electrode, thereby forming a storage electrode 30 having the lower plate 16 and upper plate 25 which ale electrically connected to each other by means of bars 23 of various shapes.

FIGS. 3 to 9 are sectional views showing a process for manufacturing the storage electrode according to the present invention.

Figure 3:
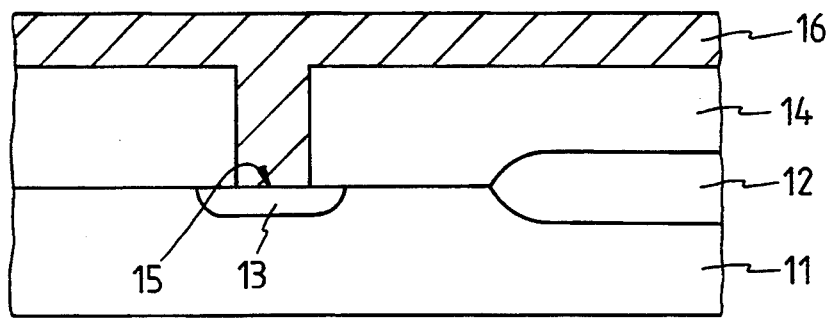
FIGS. 3 to 9 are sectional views showing a process for manufacturing the storage electrode of the DRAM cell according to the present invention.

Referring to FIG. 3, the field oxide layer 12 is formed on the silicon substrate 11, and the MOSFET (not shown) having the source, drain and gate electrode is formed. The first insulating layer 14, e.g., an oxide layer, is formed on the whole surface of the structure, and the first insulating layer 14 formed on the drain diffusion region 13 is etched to allow the storage electrode to contact the drain diffusion region 13 of the MOSFET, thereby forming the contact hole 15. Then, the first conductive layer 16 for forming the lower plate of the storage electrode is deposited thereon.

Figure 4:
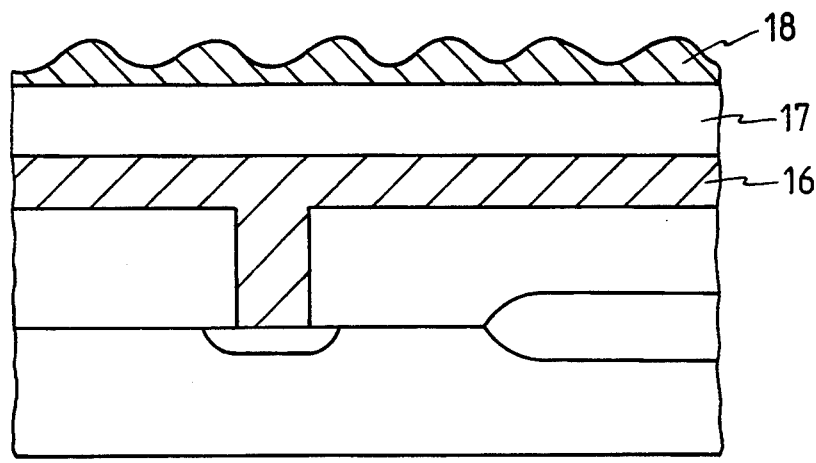

Referring to FIG. 4, a second insulating layer 17, e.g., an oxide layer of a predetermined thickness, is formed over the first conductive layer 16, and a polysilicon layer 18 having a rugged structure on its surface is deposited on the second insulating layer 17. The polysilicon layer 18 having the rugged structure is obtained such that a polysilicon layer is deposited via a low-pressure chemical vapor deposition (LPCVD) by inflowing silane ($SiH_4$) under the state of 50~500 mtorr at a temperature of 550°~600° C., and is annealed in a chamber of nitrogen ($N_2$) ambient under a pressure of below 200 mtorr for 30 minutes. Also, since the thickness of the second insulating layer 17 is the height of the bar formed between the lower and upper plates of storage electrode, the thickness of the second insulating layer 17 should be properly adjusted in accordance with the required area of the storage electrode.

Figure 5:
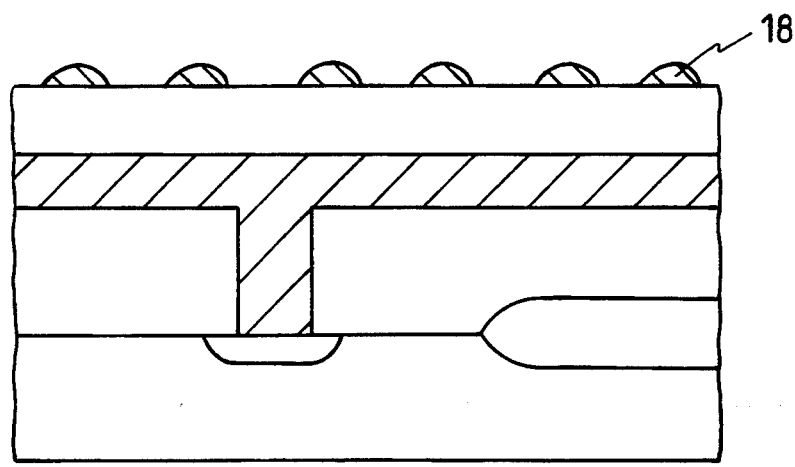

Referring to FIG. 5, the polysilicon layer 18 having the rugged structure is etched by a predetermined thickness via a dry etch to expose a predetermined upper portion of the second insulating layer 17, and the polysilicon layer 18 of ridge portions are left. Here, the polysilicon layers 18 of the ridge portions remain as islands of various shapes.

Figure 6:
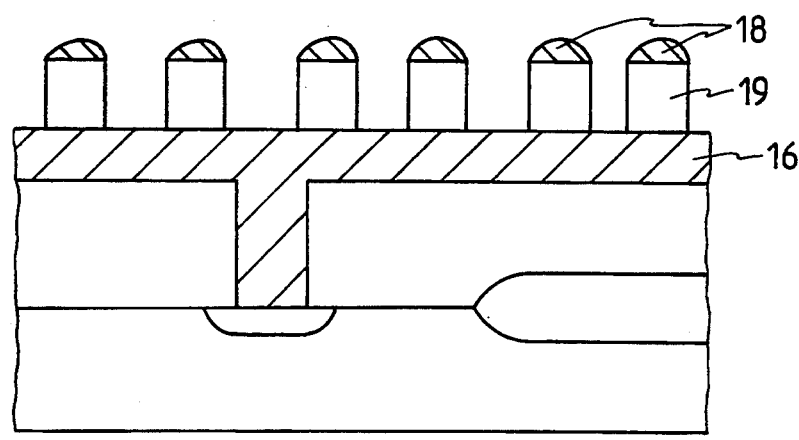

Referring to FIG. 6, the second insulating layer 17 of the exposed portion is etched, using the remaining polysilicon layer 18 of the ridge portion as a mask, thereby forming an insulating layer pattern 19 with bars of various shapes.

Figure 7:
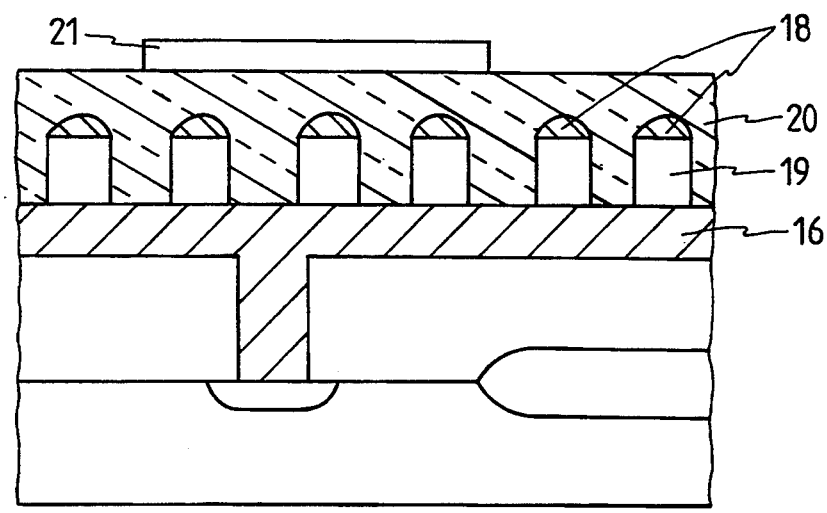

Referring to FIG. 7, a second conductive layer 20, e.g., a polysilicon layer having a predetermined thickness, for the upper plate of storage electrode is deposited on the whole surface of the structure, and a photoresist pattern 21 is formed thereon to be used as a storage-electrode mask. Alternatively, after performing the process illustrated in FIG. 6, the second conductive layer 20 for the upper plate of storage electrode may be formed after etching the polysilicon 18 of the ridge portions.

Figure 8:
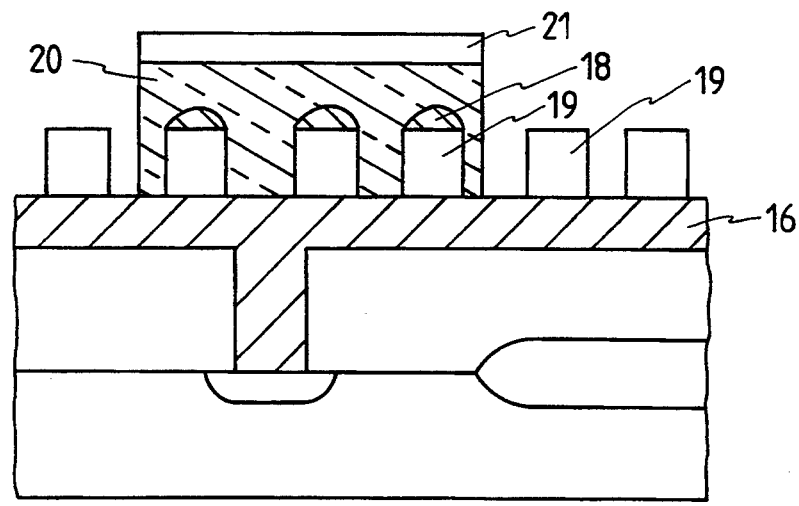

Referring to FIG. 8, the second conductive layer 20 and the polysilicon layer 18 of the ridge portion formed on the second insulating layer pattern 19 is removed, using the photoresist pattern 21. At this time, while etching the second conductive layer 20, the etching may be stopped just after the upper surface of the second insulating layer pattern 19 is exposed.

Figure 9:
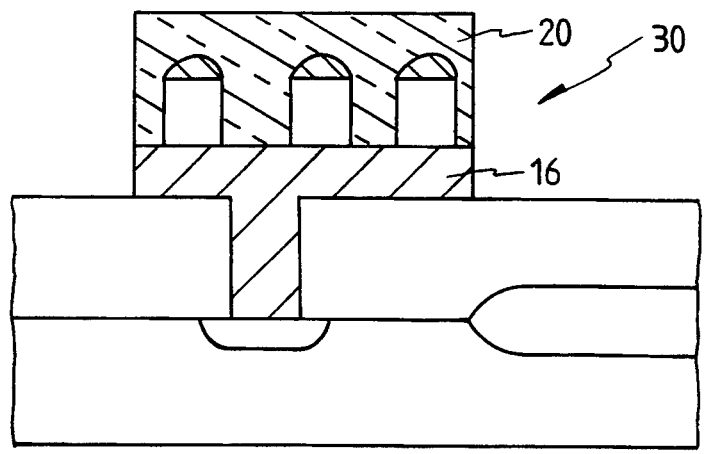

Referring to FIG. 9, after completely removing a portion having the photoresist pattern 21 thereon or the bar-shaped second insulating layer pattern 19 without the photoresist pattern 21 thereon through a wet etch, the remaining second conductive layer 20 and first conductive layer 16 are etched, using the photoresist pattern 21 as a mask. Then, the photoresist pattern 21 is removed to form the storage electrode 30 on the lower plate thereof which is electrically connected to the upper plate via the bar-shaped second conductive layer 20 filling up the portion without the second insulating layer pattern 19. Here, the second insulating layer pattern 19 between the second conductive layer 20 and the first conductive layer 16 is etched from the exposed outer wall thereof by means of an etchant for wet-etching, and then thoroughly removed up to the inner portion.

After executing the above-described process, a dielectric layer and a plate electrode are formed on the surface of the storage electrode as in a process of manufacturing a common capacitor.

Figure 10:
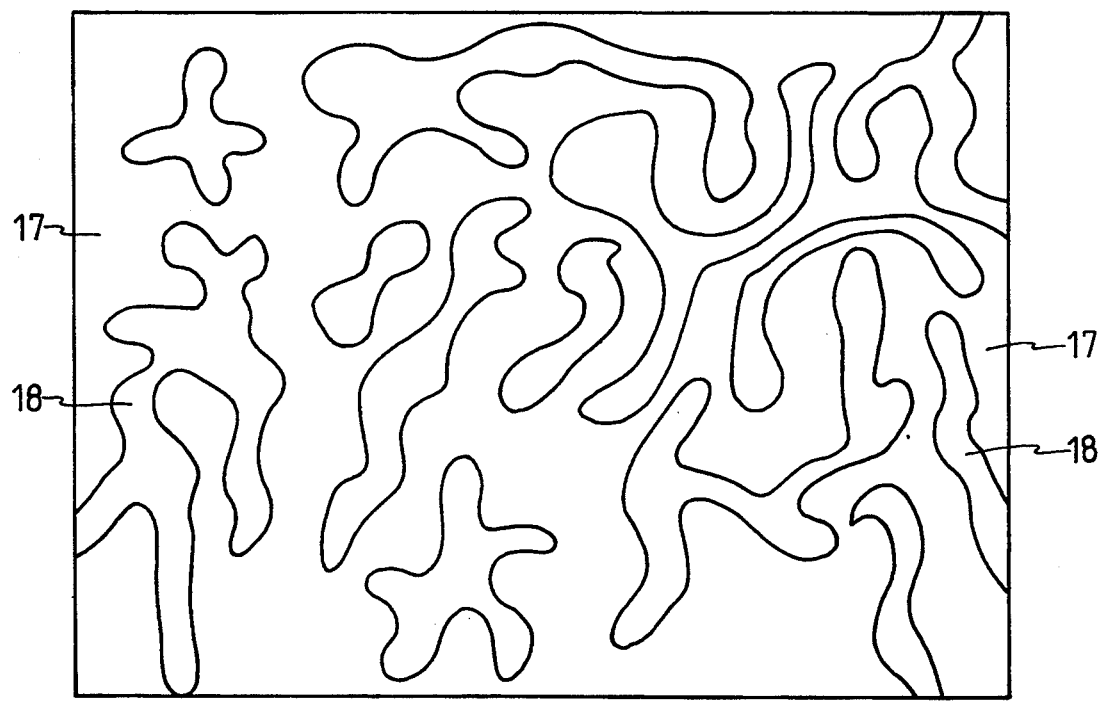
FIG. 10 is a plan view of the polysilicon layer of the ridge portion formed in FIG. 5.

FIG. 10 is a plan view showing the polysilicon layers 18 having the ridge portions remaining on the second insulating layer 17 after carrying out the process illustrated with reference to FIG. 5. It can be noted that the polysilicon layers 18 of the ridge portions remain as islands of various shapes.

According to the present invention as described above, the bars of various shapes are formed between the upper and lower plates of storage electrode, so that the capacity of the capacitor can be increased over that of the conventional tunnel-type storage electrode in the same area.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a storage electrode of a DRAM cell comprising the steps of:
   providing a lower electrode plate by forming a first conductive layer onto a first insulating layer connected with a diffusion region of a transistor;
   forming a second insulating layer on said first conductive layer, said second insulating layer having upper and lower surfaces wherein said lower surface is adjacent to said first conductive layer;
   patterning said second insulating layer to expose portions of said first conductive layer;
   providing an upper electrode plate and a plurality of electrode bars for electrically connecting said upper electrode plate with said lower electrode plate by forming a second conductive layer on the upper surface of said second insulating layer and the exposed portions of said first conductive layer;
   patterning a photoresist mask on said second conductive layer;
   etching said second conductive layer to pattern said upper electrode plate;
   thoroughly removing said second insulating layer formed on said first conductive layer; and
   etching said first conductive layer to pattern said lower electrode plate.

2. A method for manufacturing a storage electrode of a DRAM cell as claim in claim 1, wherein said second insulating layer pattern is formed by steps of:
   depositing a polysilicon layer having a rugged structure thereon onto said second insulating layer;
   etching said polysilicon layer by a predetermined thickness to expose portions of said second insulating layer; and
   etching exposed portions of said second insulating layer to form regions of said electrode bars.

3. A method for manufacturing a storage electrode of a DRAM cell as claim in claim 2, wherein said upper electrode plate is connected to a drain diffusion region of transistor.

4. A method for manufacturing a storage electrode of a DRAM cell comprising the steps of:

depositing a first conductive layer to form a lower electrode plate on a first insulating layer, said lower electrode plate being connected to a drain diffusion region of a transistor;

forming a second insulating layer on said first conductive layer;

depositing a polysilicon layer having a rugged structure thereon on said second insulating layer;

providing polysilicon layers of ridge portions by etching a predetermined thickness of said polysilicon layer having said rugged structure via a dry etch to expose predetermined portions of said second insulating layer;

etching said second insulating layer to form a second insulating layer pattern, using said polysilicon layers of said ridge portions as masks;

depositing a second conductive layer for forming an upper electrode plate and a plurality of electrode bars;

forming a photoresist pattern for a storage electrode mask on the upper portion of said second conductive layer;

etching said second conductive layer and the polysilicon layer of ridge portions via a dry etch, using said photoresist pattern as a mask;

thoroughly etching said second insulating layer pattern;

etching remaining second conductive layer and first conductive layer via a dry etch, using said photoresist pattern as a mask; and removing said photoresist pattern.

5. A method for manufacturing a storage electrode of a DRAM cell as claimed in claim 4, wherein said polysilicon layer having said rugged structure is formed such that the polysilicon layer is deposited via a low pressure chemical vapor deposition by inflowing silane ($SiH_4$) under the state of 50~500 mtorr at a temperature of 550°~600° C., and is annealed in a chamber of nitrogen ($N_2$) ambient under a pressure of below 200 mtorr for 30 minutes.

6. A method for manufacturing a storage electrode of a DRAM cell as claim in claim 4, wherein, after forming said second insulating layer pattern, said polysilicon layer of said ridge portion is etched, and then said second conductive layer is formed.

* * * * *